United States Patent [19]
Zandi et al.

[11] Patent Number: 6,008,745
[45] Date of Patent: Dec. 28, 1999

[54] VARIABLE LENGTH DECODING USING LOOKUP TABLES

[75] Inventors: Ahmad Zandi, Cupertino; Krishna K. Noru, Mountain View, both of Calif.

[73] Assignee: Sun Microsystems, Inc., Palo Alto, Calif.

[21] Appl. No.: 09/024,490

[22] Filed: Feb. 17, 1998

[51] Int. Cl.[6] .................................................. H03M 7/40
[52] U.S. Cl. .............................................................. 341/67
[58] Field of Search ............................ 341/67, 106, 107, 341/65, 55, 87

[56] References Cited

U.S. PATENT DOCUMENTS

| | | | |
|---|---|---|---|
| 5,220,325 | 6/1993 | Ackland et al. | 341/67 |
| 5,253,053 | 10/1993 | Chu et al. | 358/133 |
| 5,343,195 | 8/1994 | Cooper | 341/67 |
| 5,414,468 | 5/1995 | Lee | 348/402 |
| 5,821,887 | 10/1998 | Zhu | 341/67 |

*Primary Examiner*—Brian Young
*Attorney, Agent, or Firm*—Park & Vaughan LLP

[57] ABSTRACT

One embodiment of the present invention provides a method and an apparatus for decoding a variable length code using lookup tables. This embodiment improves lookup performing by allowing multiple symbols to be retrieved in a single lookup, and allowing lookups into different tables to proceed in parallel. Another embodiment of the present invention provides for multiple secondary lookup tables to be selected based upon a prefix value decoded by a primary lookup table. Thus, one embodiment of the present invention can be characterized as an apparatus for decoding a variable length code. This apparatus includes an input from an encoded bitstream, the input including a first set of bits and a second set of bits. This apparatus also includes a first table indexed by the first set of bits, which includes entries containing decoded symbols corresponding to variable length codewords in the first set of bits. At least one entry contains multiple symbols for the case where the first set of bits contains multiple codewords. Another embodiment includes a second table indexed by the second set of bits. This second table includes entries containing decoded symbols corresponding to variable length codewords spanning the first set of bits and the second set of bits. In yet another embodiment, the first table and the second table are configured to allow a lookup from the first table to proceed in parallel with a lookup from the second table. In another embodiment, the first table and the second table are configured so that a lookup in the first table precedes a lookup in the second table.

46 Claims, 9 Drawing Sheets

| Variable length code (Note 1) | Run | Level |
|---|---|---|
| 0110 (Note 2) | End of Block | |
| 10 s | 0 | 1 |
| 010 s | 1 | 1 |
| 110 s | 0 | 2 |
| 0010 1 s | 2 | 1 |
| 0111 s | 0 | 3 |
| 0011 1 s | 3 | 1 |
| 0001 10 s | 4 | 1 |
| 0011 0 s | 1 | 2 |
| 0001 11 s | 5 | 1 |
| 0000 110 s | 6 | 1 |
| 0000 100 s | 7 | 1 |
| 1110 0 s | 0 | 4 |
| 0000 111 s | 2 | 2 |
| 0000 101 s | 8 | 1 |
| 1111 000 s | 9 | 1 |
| 0000 01 | Escape | |
| 1110 1 s | 0 | 5 |
| 0001 01 s | 0 | 6 |
| 1111 001 s | 1 | 3 |
| 0010 0110 s | 3 | 2 |
| 1111 010 s | 10 | 1 |
| 0010 0001 s | 11 | 1 |
| 0010 0101 s | 12 | 1 |
| 0010 0100 s | 13 | 1 |
| 0001 00 s | 0 | 7 |
| 0010 0111 s | 1 | 4 |
| 1111 1100 s | 2 | 3 |
| 1111 1101 s | 4 | 2 |
| 0000 0010 0 s | 5 | 2 |
| 0000 0010 1 s | 14 | 1 |
| 0000 0011 1 s | 15 | 1 |
| 0000 0011 01 s | 16 | 1 |

FIG. 10A

| Variable length code (Note 1) | Run | Level |
|---|---|---|
| 1111 011 s | 0 | 8 |
| 1111 100 s | 0 | 9 |
| 0010 0011 s | 0 | 10 |
| 0010 0010 s | 0 | 11 |
| 0010 0000 s | 1 | 5 |
| 0000 0011 00 s | 2 | 4 |
| 0000 0001 1100 s | 3 | 3 |
| 0000 0001 0010 s | 4 | 3 |
| 0000 0001 1110 s | 6 | 2 |
| 0000 0001 0101 s | 7 | 2 |
| 0000 0001 0001 s | 8 | 2 |
| 0000 0001 1111 s | 17 | 1 |
| 0000 0001 1010 s | 18 | 1 |
| 0000 0001 1001 s | 19 | 1 |
| 0000 0001 0111 s | 20 | 1 |
| 0000 0001 0110 s | 21 | 1 |
| 1111 1010 s | 0 | 12 |
| 1111 1011 s | 0 | 13 |
| 1111 1110 s | 0 | 14 |
| 1111 1111 s | 0 | 15 |
| 0000 0000 1011 0 s | 1 | 6 |
| 0000 0000 1010 1 s | 1 | 7 |
| 0000 0000 1010 0 s | 2 | 5 |
| 0000 0000 1001 1 s | 3 | 4 |
| 0000 0000 1001 0 s | 5 | 3 |
| 0000 0000 1000 1 s | 9 | 2 |
| 0000 0000 1000 0 s | 10 | 2 |
| 0000 0000 1111 1 s | 22 | 1 |
| 0000 0000 1111 0 s | 23 | 1 |
| 0000 0000 1110 1 s | 24 | 1 |
| 0000 0000 1110 0 s | 25 | 1 |
| 0000 0000 1101 1 s | 26 | 1 |

FIG. 10B

| Variable length code (Note 1) | Run | Level |
|---|---|---|
| 0000 0000 0111 11 s | 0 | 16 |
| 0000 0000 0111 10 s | 0 | 17 |
| 0000 0000 0111 01 s | 0 | 18 |
| 0000 0000 0111 00 s | 0 | 19 |
| 0000 0000 0110 11 s | 0 | 20 |
| 0000 0000 0110 10 s | 0 | 21 |
| 0000 0000 0110 01 s | 0 | 22 |
| 0000 0000 0110 00 s | 0 | 23 |
| 0000 0000 0101 11 s | 0 | 24 |
| 0000 0000 0101 10 s | 0 | 25 |
| 0000 0000 0101 01 s | 0 | 26 |
| 0000 0000 0101 00 s | 0 | 27 |
| 0000 0000 0100 11 s | 0 | 28 |
| 0000 0000 0100 10 s | 0 | 29 |
| 0000 0000 0100 01 s | 0 | 30 |
| 0000 0000 0100 00 s | 0 | 31 |
| 0000 0000 0011 000 s | 0 | 32 |
| 0000 0000 0010 111 s | 0 | 33 |
| 0000 0000 0010 110 s | 0 | 34 |
| 0000 0000 0010 101 s | 0 | 35 |
| 0000 0000 0010 100 s | 0 | 36 |
| 0000 0000 0010 011 s | 0 | 37 |
| 0000 0000 0010 010 s | 0 | 38 |
| 0000 0000 0010 001 s | 0 | 39 |
| 0000 0000 0010 000 s | 0 | 40 |
| 0000 0000 0011 111 s | 1 | 8 |
| 0000 0000 0011 110 s | 1 | 9 |
| 0000 0000 0011 101 s | 1 | 10 |
| 0000 0000 0011 100 s | 1 | 11 |
| 0000 0000 0011 011 s | 1 | 12 |
| 0000 0000 0011 010 s | 1 | 13 |
| 0000 0000 0011 001 s | 1 | 14 |

FIG. 10C

| Variable length code (Note 1) | Run | Level |
|---|---|---|
| 0000 0000 0001 0011 s | 1 | 15 |
| 0000 0000 0001 0010 s | 1 | 16 |
| 0000 0000 0001 0001 s | 1 | 17 |
| 0000 0000 0001 0000 s | 1 | 18 |
| 0000 0000 0001 0100 s | 6 | 3 |
| 0000 0000 0001 1010 s | 11 | 2 |
| 0000 0000 0001 1001 s | 12 | 2 |
| 0000 0000 0001 1000 s | 13 | 2 |
| 0000 0000 0001 0111 s | 14 | 2 |
| 0000 0000 0001 0110 s | 15 | 2 |
| 0000 0000 0001 0101 s | 16 | 2 |
| 0000 0000 0001 1111 s | 27 | 1 |
| 0000 0000 0001 1110 s | 28 | 1 |
| 0000 0000 0001 1101 s | 29 | 1 |
| 0000 0000 0001 1100 s | 30 | 1 |
| 0000 0000 0001 1011 s | 31 | 1 |

NOTES
1. The last bit 's' denotes the sign of the level: '0' for positive, '1' for negative.
2. "End of Block" shall not be the only code of the block.

FIG. 10D

VARIABLE LENGTH DECODING USING LOOKUP TABLES

BACKGROUND

1. Field of the Invention

The present invention relates to decoding of a variable length code, such as a Huffman code, and more particularly to a scheme for variable length decoding in a computer system using lookup tables.

2. Related Art

The recent development of computer-based applications such as video telephony, video conferencing and multimedia has lead to the development of compression techniques for video data in computer systems. These compression techniques reduce the amount of data required to represent moving images and corresponding sound to a manageable quantity. This facilitates transmission of video data over communication networks as well as the storage of video data in data storage devices for later retrieval.

To this end standards have been developed to specify how video data is compressed. One of these standards is the Motion Picture Experts Group (MPEG) standard. The MPEG standard specifies a compressed format for motion picture video and associated sound in order to facilitate transmission of video images at rates up to 30 frames per second. The MPEG standard additionally provides other features, such as single frame advance, reverse motion and still frame video.

Under the MPEG standard, an image is encoded by breaking the image into distinct areas, sampling data from these areas, and representing each area in coded form. This data is coded by a transmitting device and decoded by a receiving device in order to facilitate transmission of full motion video across a communication network. Alternatively, coded video data may be stored in a computer system main memory or in a non-volatile storage device, such as a disk drive, for later viewing.

Under standards such as MPEG, video data is compressed by exploiting statistical redundancies in the video data. The MPEG standard encodes video data using a variant of Huffman coding, which is a "variable length" coding scheme. Variable length coding schemes convert symbols (from a stream of symbols such as a video stream) into variable length codewords, wherein each symbol is associated with a unique codeword. These codewords are assigned to symbols so that more commonly occurring symbols are assigned to shorter codewords, and less commonly occurring symbols are assigned to longer codewords. If done properly, this can minimize the amount of encoded data required to represent a stream of symbols.

In order to decode a variable length codeword, some existing systems parse the bitstream containing the codeword using a binary tree. This technique is very slow. Other systems use a single lookup table of symbols for all possible codewords. The problem with such a lookup table is that it must be large enough to accommodate the largest possible codeword. Under the MPEG-II standard, codewords can be as large as 17 bits in size, necessitating a table of size $2^{17}=131,072$ entries. Tables of this size can be prohibitively expensive to implement because they consume a large amount of memory, and prohibitively slow, because larger memories require longer access times. Note that decoding speed can be a critical bottleneck for applications such as video conferencing and MPEG playback, which may require up to 30 frames per second of data.

A scheme that uses multiple lookup tables is described in U.S. Pat. No. 5,253,053, entitled "Variable Length Decoding Using Lookup Tables," to inventors Chu, et al. This patent discloses a scheme that uses two smaller lookup tables to decode a variable length codeword. A first table, called a "frequent" table, is used to decode frequently occurring smaller codewords. A second table, called an "infrequent" table, is used to decode less frequently occurring longer codewords.

Although the scheme proposed in the above patent reduces memory requirements for the lookup tables, it suffers from a number of drawbacks. First, the schemes does not take advantage of the possibility of performing multiple table lookups in parallel, which can increase performance. Second, variable length codewords are typically not matched to the lookup table size. Consequently, after a lookup is performed, the remaining bits in the input stream must often be realigned. This realignment process can be a time-consuming. Third, the two stage lookup process disclosed in the above patent does not disclose the possibility of selecting different secondary lookup tables based upon which prefix value was inputted into the primary lookup table. This selection of different secondary lookup tables allows more general types of variable length codes to be decoded.

SUMMARY

One embodiment of the present invention provides a method and an apparatus for decoding a variable length code using lookup tables. This embodiment improves lookup performing by allowing multiple symbols to be retrieved in a single lookup, and allowing lookups into different tables to proceed in parallel. Another embodiment of the present invention provides for multiple secondary lookup tables to be selected based upon a prefix value decoded by a primary lookup table. Thus, one embodiment of the present invention can be characterized as an apparatus for decoding a variable length code. This apparatus includes an input from an encoded bitstream, the input including a first set of bits and a second set of bits. This apparatus also includes a first table indexed by the first set of bits, which includes entries containing decoded symbols corresponding to variable length codewords in the first set of bits. At least one entry contains multiple symbols for the case where the first set of bits contains multiple codewords. Another embodiment includes a second table indexed by the second set of bits. This second table includes entries containing decoded symbols corresponding to variable length codewords spanning the first set of bits and the second set of bits. In yet another embodiment, the first table and the second table are configured to allow a lookup from the first table to proceed in parallel with a lookup from the second table. In another embodiment, the first table and the second table are configured so that a lookup in the first table precedes a lookup in the second table.

In another embodiment of the present invention, the first set of bits and the second set of bits have bits in common. In another embodiment, the first set of bits and the second set of bits are disjoint.

A further embodiment includes a third table. In this embodiment the second table and the third table are configured so that second table is indexed when the first set of bits contains a partial codeword indicating an entry from the second table is required. Alternatively, the third table is indexed when the first set of bits contains a partial codeword indicating an entry from the third table is required.

In another embodiment, entries in the first table include a header. This header can specify the number of symbols in the entry as well as an end-of-block symbol or an escape symbol. In another embodiment, entries in the first table include a shift value indicating a number of bits to be shifted to realign the input from the encoded bit stream.

In another embodiment of the present invention, the encoded bitstream is encoded according to the Joint Photographer Experts Group (JPEG) standard. In another embodiment, the encoded bitstream is encoded according to the Motion Picture Experts Group (MPEG) standard. In yet another embodiment, the encoded bitstream is encoded according to the H.263 video conferencing standard, Another embodiment of the present invention can be characterized as a method for decoding a variable length code. This method includes receiving a first set of bits from an encoded bitstream, and using this first set of bits to index to an entry in a first table. The first table contains decoded symbols corresponding to variable length codewords in the first set of bits. The method also includes returning multiple decoded symbols from the indexed entry if the first set of bits contains multiple codewords.

Another embodiment of the present invention includes, receiving a second set of bits from an encoded bitstream, and using the second set of bits to index an entry in a second table in parallel with using the first set of bits to index an entry in the first table. The second table contains decoded symbols corresponding to variable length codewords spanning the first set of bits and the second set of bits.

Another embodiment of the present invention includes, for the case where the first set of bits contains only a partial codeword: receiving a second set of bits from the encoded bit stream; using the second set of bits to index an entry in a second table if the first set of bits contains a partial codeword indicating an entry from the second table is required; and using the second set of bits to index an entry in a third table if the first set of bits contains a partial codeword indicating an entry from the third table is required.

DESCRIPTION OF THE FIGURES

FIGS. 10A, 10B, 10C and 10D specify an encoding under the MPEG-II standard to be decoded by the table structures illustrated in FIGS. 3, 5 and 6.

DEFINITIONS

Codeword—an encoded representation of a symbol.

Huffman Code—a prefix code featuring codewords of variable length.

Symbol—a data item in an uncompressed bitstream.

DETAILED DESCRIPTION OF THE INVENTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Description of Computer System

Figure 1:
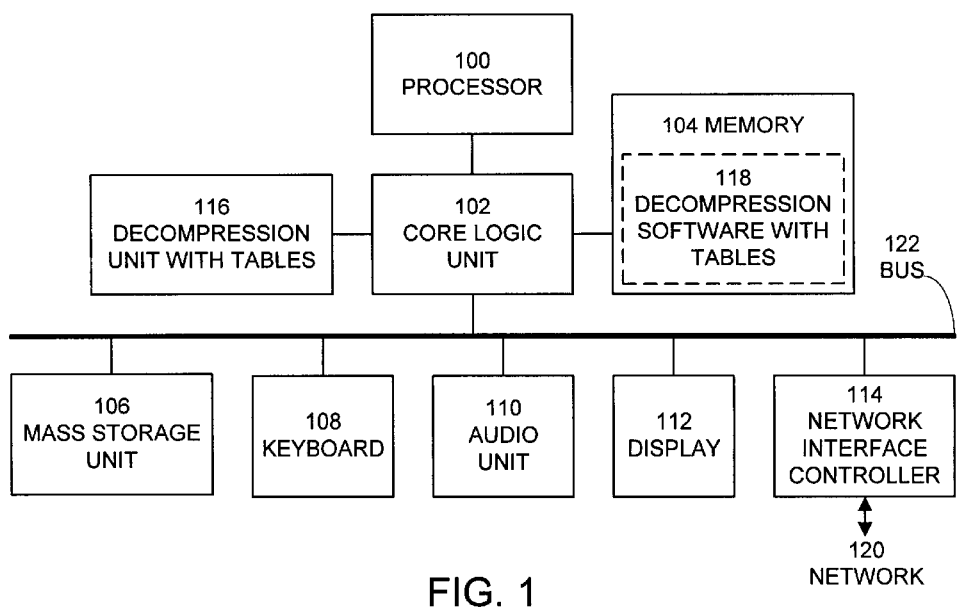
FIG. 1 is a block diagram of a computer system including hardware and software resources for decompressing video data in accordance with an embodiment of the present invention.

FIG. 1 is a block diagram of a computer system including hardware and software resources for decompressing video data in accordance with an embodiment of the present invention. The computer system illustrated in FIG. 1 includes processor 100, which is coupled to core logic unit 102. Core logic unit 102 is additionally coupled to memory 104, decompression unit 116 and bus 122. Processor 100 may be any type of processor that can be used in a computing system. This includes, but is not limited to microprocessors, mainframe processors, and device controllers. Core logic unit 102 includes circuitry to couple processor 100 to memory 104 and bus 122. Memory 104 is any type of random access memory that can be used to store code and data for processor 100.

The embodiment illustrated in FIG. 1 includes resources to support decoding of video data in both hardware and software. Decompression unit 116 includes hardware with lookup tables to assist in the decompression process. In this embodiment, decompression unit 116 is coupled to processor 100 through core logic unit 100. However, in other embodiments, decompression unit 116 is coupled to processor 100 through bus 122. Memory 104 includes decompression software 118 with lookup tables to assist in the decompression of variable length codes. Although both hardware and software support for video compression are illustrated in FIG. 1, a computer system will typically include either hardware support or software support, but not both.

Processor 100 can communicate with additional computer system resources across bus 122. Bus 122 is coupled to, mass storage unit 106, keyboard 108, audio unit 110, display 112 and network interface controller 114. Mass storage unit 106 may be any type of nonvolatile storage device for storing code and data used by processor 100. Keyboard 108 can include any type of alphanumeric keyboard for a computer system. Audio unit 110 processes audio signals from the computer system for output. Display 110 is any type of display that can be used with a computer system, including, but not limited to, a graphical display on a cathode ray tube or a flat panel LCD. Network interface controller 114 can be any type of interface to a computer network 120.

During system operation, compressed video data streams into the computer system from a remote site across network 120 and through network interface controller 114. This occurs, for example, in applications such as video conferencing. Alternatively, compressed video data may originate from mass storage unit 106. In this case, the compressed video data was previously stored on mass storage unit 106 for future playback. Regardless of the source of the compressed video data, it feeds into decompression unit 116, where it is decompressed and is then transferred to audio unit 110 and display 112 for output. Alternatively, if the computer system does not have a hardware decompression unit 116, video data can be decompressed by processor 100 using decompression software 118. This decompression software includes corresponding decompression tables.

Description of Decoding System

Figure 2:
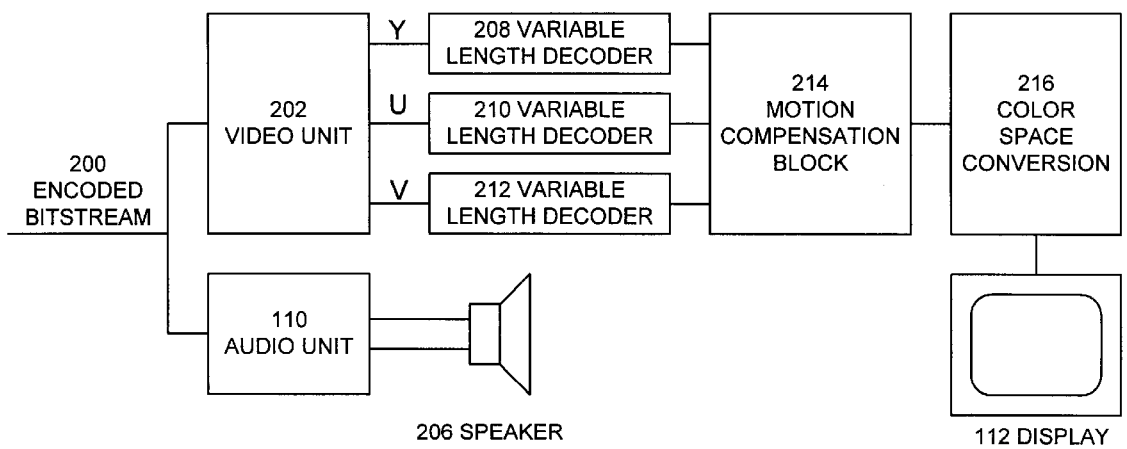
FIG. 2 is a block diagram of some of the components of a system for decoding and playing compressed video data in accordance with an embodiment of the present invention.

FIG. 2 is a block diagram of some of the components of a system for decoding and playing compressed video data in accordance with an embodiment of the present invention. FIG. 2 represents the hardware structures that may be found within decompression unit 116 from FIG. 1. Alternatively, FIG. 2 may represent analogous software structures that within decompression software 118 from FIG. 1.

During operation, an encoded bitstream 200 feeds into the system illustrated in FIG. 2 from the left-hand-side. This encoded bitstream 200 can be encoded according to any video standard. This includes, but is not limited to, video data encoded according to the MPEG and JPEG standards, as well as the H.263 video conferencing standard. Encoded bitstream 200 is split into an audio portion and a video portion. The audio portion feeds into audio unit 110 from FIG. 1. Audio unit 110 processes the audio input and converts it into a form suitable for output through an attached speaker 206. The video portion feeds into video unit 202, which breaks up the video portion into Y, U and V components, representing luminance and chrominance information. Video components Y, U and V then feed into variable length decoders 208, 210 and 212, respectively. These variable length decoders convert codewords from the Y, U and V components into decoded symbols. After feeding through variable length decoders 208, 210 and 212, the decoded Y, U and V components feed into motion compensation block 204, which forms predictions from previously decoded pictures. These predictions are combined with the YUV data to recover final decoded video data. After motion compensation block 214, the decoded video data feeds into color space conversion unit 216, which remaps the color values of the video data. Finally, the video data is output to a display 112 (from FIG. 1). Although the embodiment illustrated in FIG. 2 includes three separate decoders 208, 210 and 212, other embodiments use a single decoder (or a single piece of decoding software) to perform the decoding functions.

Description of Two-Lookup Table Configuration

Figure 3:
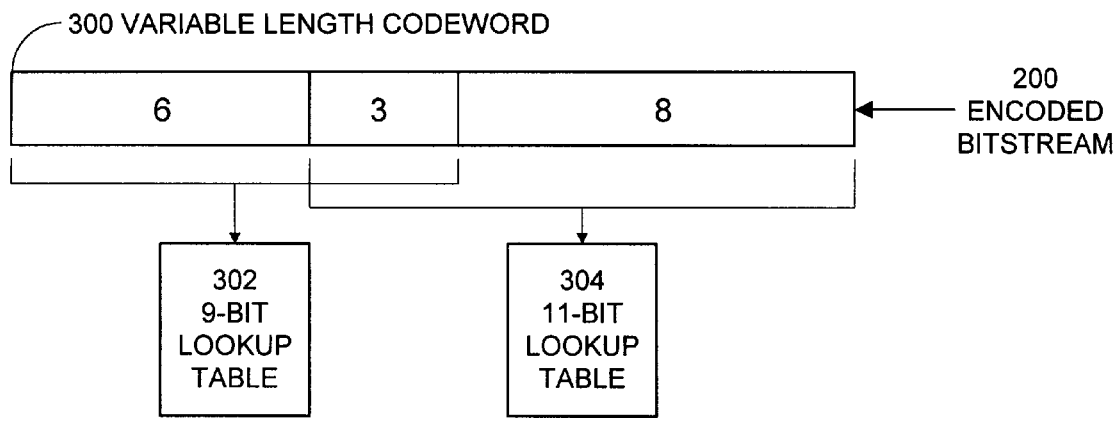
FIG. 3 illustrates a two-lookup table configuration in accordance with an embodiment of the present invention.

FIG. 3 illustrates a two-lookup table configuration in accordance with an embodiment of the present invention. This embodiment receives a variable length codeword (VLC) 300 from encoded bitstream 200 (from FIG. 2). Under the MPEG-II standard, VLC 300 can be up to 17 bits in size (See FIGS. 10A, 10B, 10C and 10D). Furthermore, under the MPEG-II standard as codified in ISO/IEC 13818-2, it is possible to determine a codeword's size from the number of leading zeros in the codeword (See FIGS. 10A, 10B, 10C and 10D). More specifically, for the following numbers of leading zeros: 6, 7, 8, 9, 11 and 12, the corresponding codeword sizes are: 11, 13, 14, 15, 16, 17, respectively. If there are fewer than six leading zeros, the codeword will be nine bits in size or less. This property allows the maximum codeword size to be determined by looking at the most significant bits of the codeword.

In the configuration illustrated in FIG. 3, a nine-bit lookup table 302 is indexed by the nine most significant bits of VLC 300, and an 11-bit lookup table 304 is indexed by the least significant 11 bits of VLC 300. Note that the nine most significant bits and the eleven least significant bits have three bits in common because VLC 300 is at most 17 bits in size.

By examining the first nine bits of VLC 300 using primary lookup table 302, the system can determine whether or not secondary lookup table 304 must be used. Recall that if VLC 300 has more than five leading zeros, VLC 300 is more than nine bits in size. Lookup table 304 is not needed for codewords of nine bits or less in size.

Figure 4:
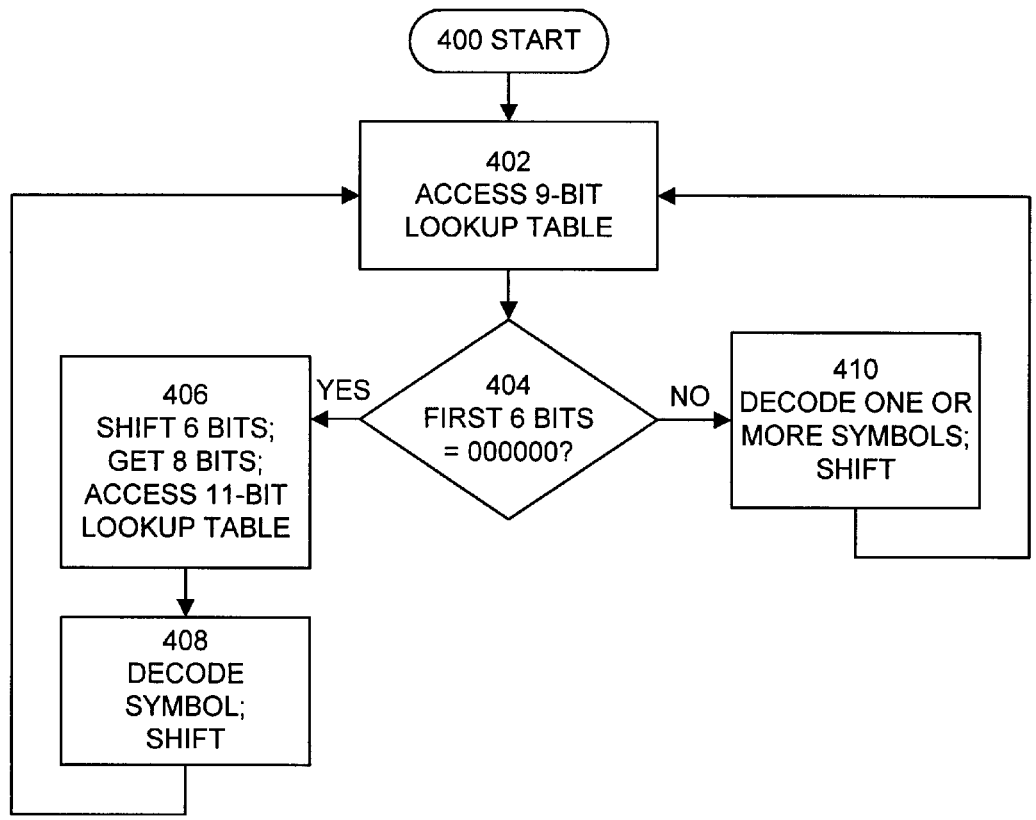
FIG. 4 is a flow chart of illustrating the operation of the two-lookup table configuration illustrated in FIG. 3 in accordance with an embodiment of the present invention.

FIG. 4 is a flow chart of illustrating the operation of the two-lookup table configuration illustrated in FIG. 3 in accordance with an embodiment of the present invention. The system starts in state 400 and proceeds to state 402. In state 402, the system accesses nine-bit lookup table 302 from FIG. 3. The system then proceeds to state 404. In state 404, the system determines whether or not there are six or more leading zeros in VLC 300. If so, VLC 300 must be more than nine bits in size, and the system proceeds to state 406. If not, the system proceeds to state 410. In state 406, the system shifts away the first six zeros, and gets an additional eight bits from the input stream. The system uses the resulting 11 bits to access an 11-bit lookup table, such as lookup table 304 from FIG. 3. The system them proceeds to state 408. In state 408, the system decodes a symbol corresponding to the codeword using lookup table 304 from FIG. 3. It also shifts the remaining bits to realign the bits that were not part of the codeword. The system then returns to state 402 to repeat the process on a new codeword.

In state 410, there are less than six leading zeros in the codeword. Hence, the codeword is nine bits or less in size, and no lookup into secondary lookup table 304 from FIG. 3 is required. The system decodes one or more symbols from the nine bits and shifts the remaining bits to realign the bits that are not part of the current codeword(s). The system then returns to state 402 to repeat the process on a new codeword.

Note that under the MPEG-II standard, codewords may be as few as three bits in size. Hence, it is possible for more than one codeword to be contained in the nine bits used to index lookup table 302 (from FIG. 3). If there is more than one codeword, lookup table 302 outputs more than one symbol. This type of multiple symbol lookup can greatly improve system performance.

Description of Three-Lookup Table Configuration

Figure 5:
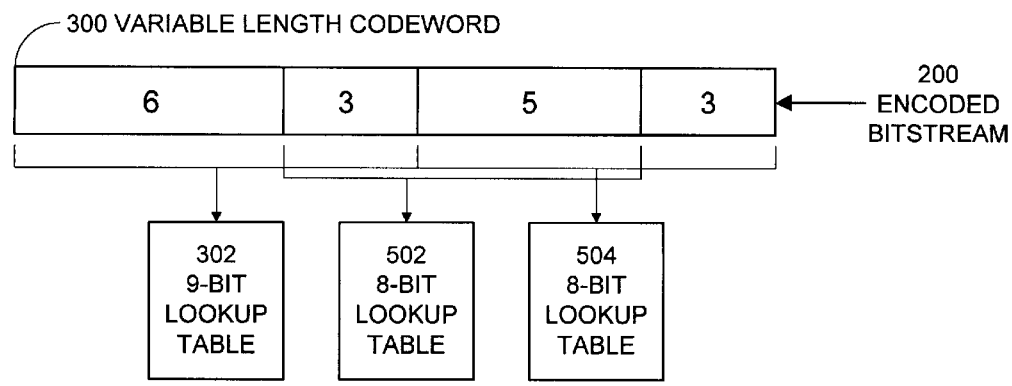
FIG. 5 illustrates a three-lookup table configuration in accordance with an embodiment of the present invention.

FIG. 5 illustrates a three-lookup table configuration in accordance with an embodiment of the present invention. This embodiment includes a nine-bit lookup table 302 from FIG. 3, which decodes the first nine bits of a codeword from encoded bitstream 200 from FIG. 2. Instead of having a single 11-bit lookup table for the last 11 bits of VLC 300 as in FIG. 3, the embodiment illustrated in FIG. 5 includes two eight-bit lookup tables that cover the last 11 bits of VLC 300. The indexes for these eight-bit lookup tables overlap in five bits.

Figure 7:
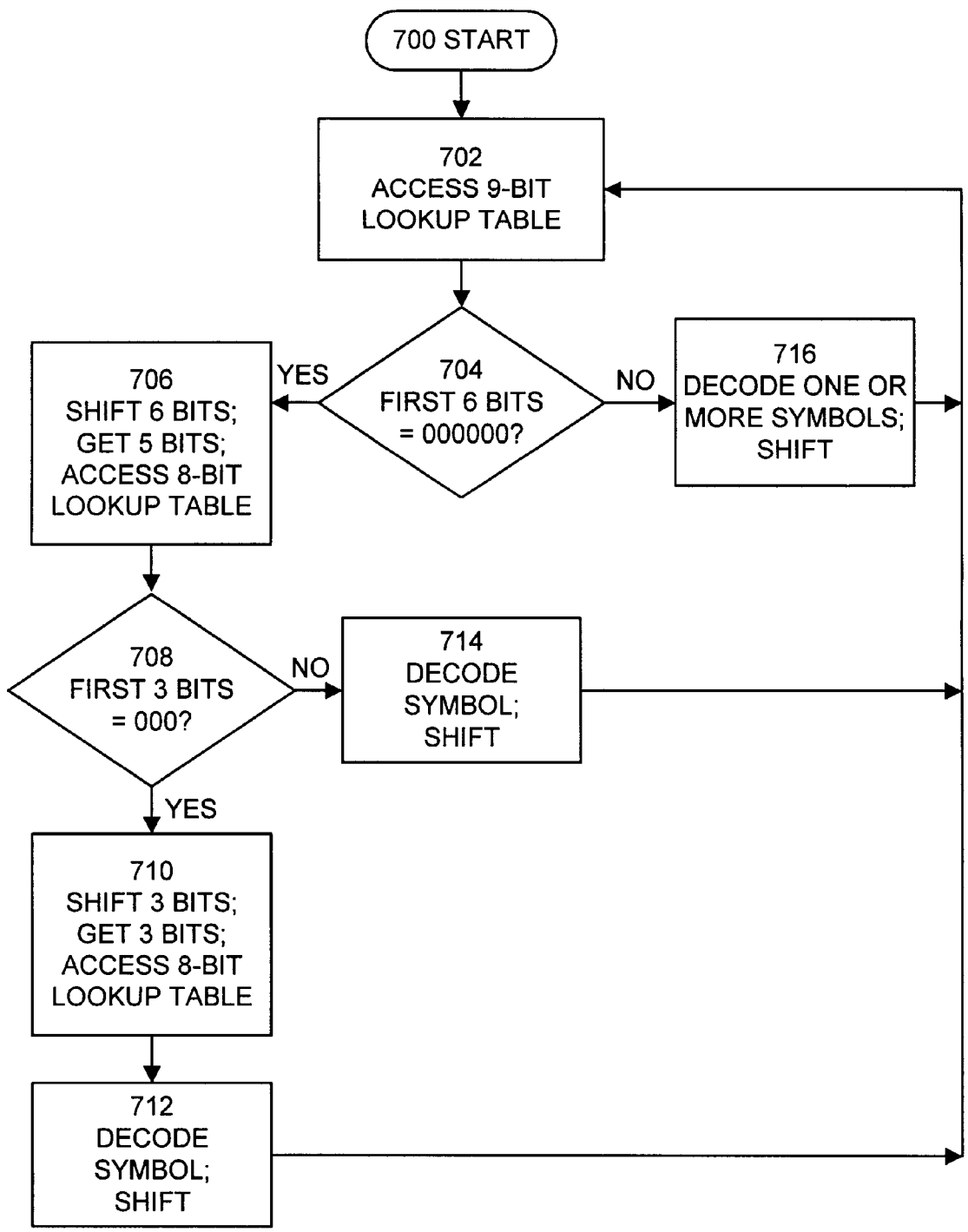
FIG. 7 is a flow chart of illustrating the operation of the three-lookup table configuration illustrated in FIG. 5 in accordance with an embodiment of the present invention.

FIG. 7 is a flow chart of illustrating the operation of the three-lookup table configuration in FIG. 5 in accordance with an embodiment of the present invention. The system starts in state 700 and proceeds to state 702. In state 702, the system accesses nine-bit lookup table 302 from FIG. 3. The system then proceeds to state 704. In state 704, the system determines whether or not there are six or more leading zeros in the codeword. If so, the codeword must be more than nine bits in size, and the system proceeds to state 706. If not, the system proceeds to state 716.

In state 706, the system shifts away the first six zeros, and gets an additional five bits from the input stream. The system uses the resulting eight bits to access an eight-bit lookup table, such as lookup table 502 from FIG. 5. The system them proceeds to state 708. In state 708, the system determines whether or not there are three or more leading zeros in the remaining codeword. If so, the codeword must be more than 14 bits in size, and the system proceeds to state 710. If not, the system proceeds to state 714.

In state 714, the system decodes a symbol corresponding to the codeword using eight-bit lookup table 502 from FIG. 5. It also shifts the remaining bits to realign the bits that were not part of the codeword. The system then returns to state 702 to repeat the process on a new codeword.

In state 710, the system shifts away the first three zeros, and gets an additional three bits from the input stream. The system uses the resulting eight bits to access an eight-bit lookup table, such as lookup table 504 from FIG. 5. The system them proceeds to state 712. In state 712, the system decodes a symbol corresponding to the codeword using eight-bit lookup table 504 from FIG. 5. It also shifts the remaining bits to realign the bits that were not part of the codeword. The system then returns to state 702 to repeat the process on a new codeword.

In state 716, there are less than six leading zeros in the codeword. Hence, the codeword is nine bits or less in size, and no additional lookups are required. The system decodes one or more symbols from the nine bits, and shifts the remaining bits to realign the bits that were not part of the current codeword. The system then returns to state 702 to repeat the process on a new codeword.

Description of Five-Lookup Table Configuration

Figure 6:
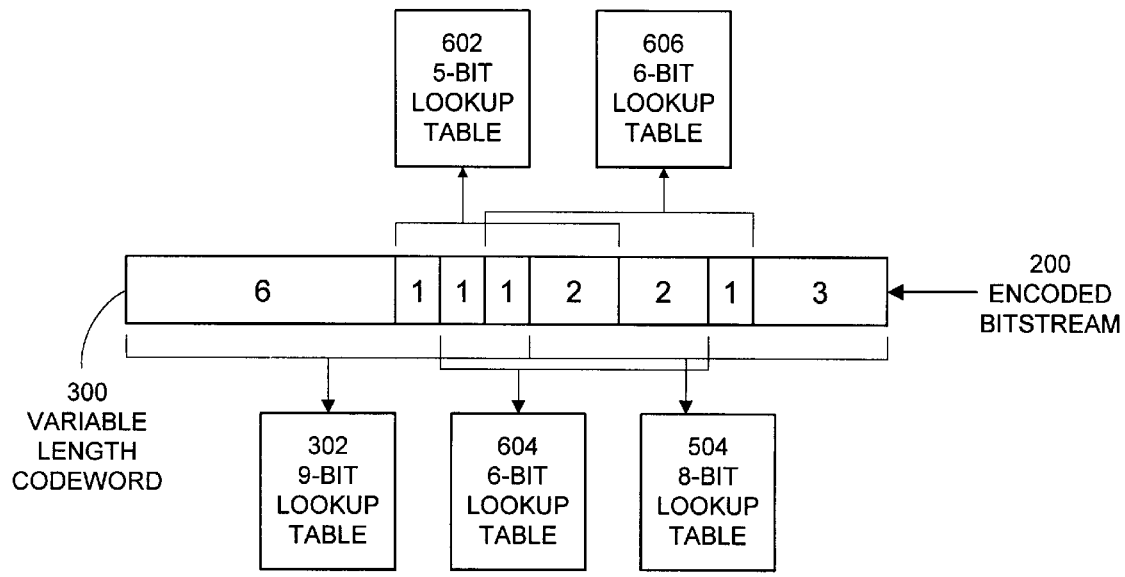
FIG. 6 illustrates a five-lookup table configuration in accordance with an embodiment of the present invention.

FIG. 6 illustrates a five-lookup table configuration in accordance with an embodiment of the present invention. This embodiment includes a nine-bit lookup table 302 from FIG. 3, which decodes the first nine bits of a codeword from encoded bitstream 200 from FIG. 2. It also includes an eight-bit lookup table 504 from FIG. 5, which decodes the last eight bits of the codeword. Instead of having a single 8-bit lookup table for the middle eight bits of the codeword, such as table 502 in FIG. 5, the embodiment illustrated in FIG. 6 includes one five-bit lookup table and two six-bit lookup tables to cover the middle 8 bits. Note that the indexes for these lookup tables overlap.

Figure 8:
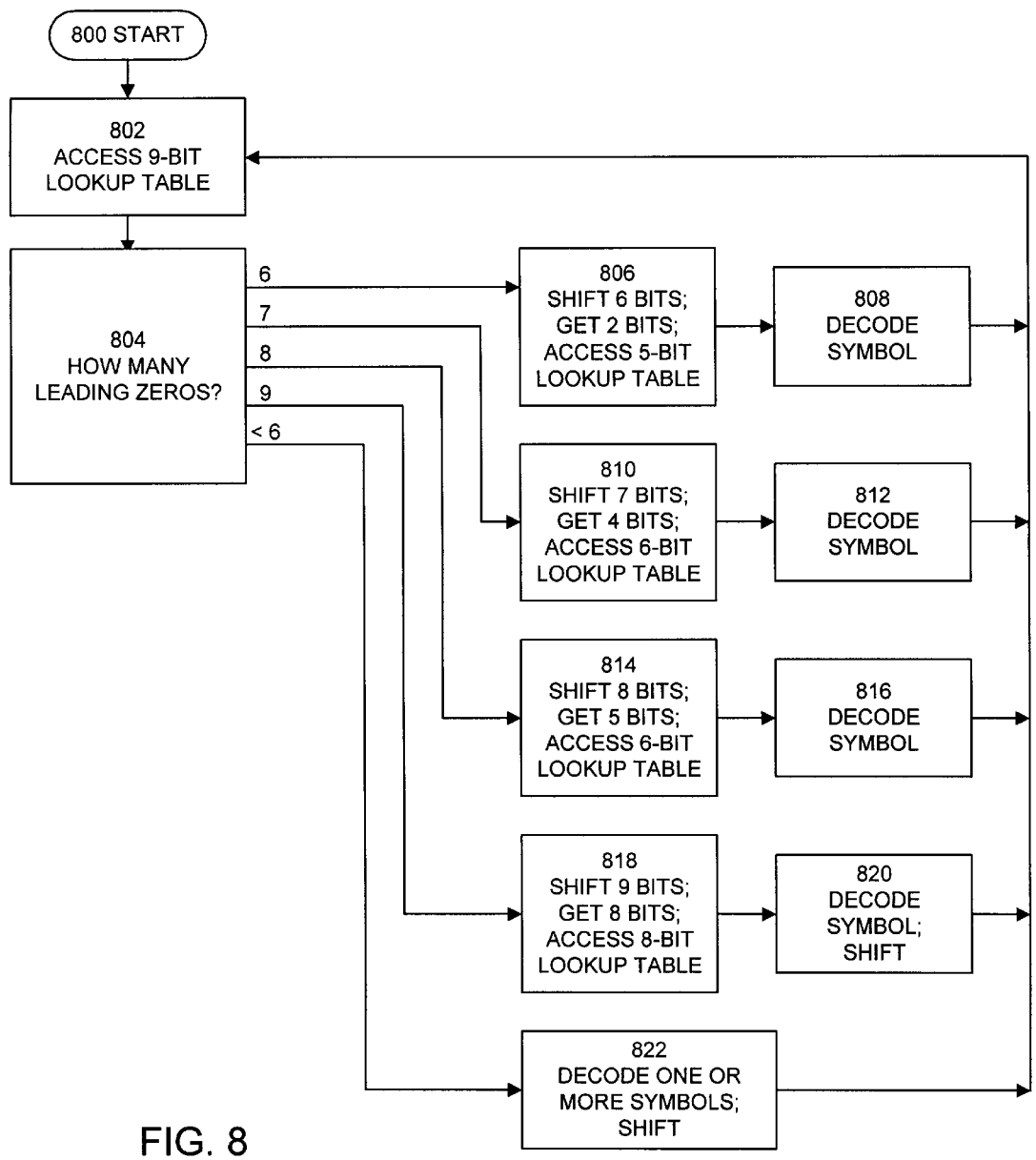
FIG. 8 is a flow chart of illustrating the operation of the five-lookup table configuration illustrated in FIG. 6 in accordance with an embodiment of the present invention.

FIG. 8 is a flow chart of illustrating the operation of the five-lookup table configuration illustrated in FIG. 6 in accordance with an embodiment of the present invention. The system starts in state 800 and proceeds to state 802. In state 802, the system accesses nine-bit lookup table 302 from FIG. 3. The system then proceeds to state 804. In state 804, the system determines how many leading zeros are in the codeword. If there are six leading zeros, the system proceeds to state 806. If there are seven leading zeros, the system proceeds to state 810. If there are eight leading zeros, the system proceeds to state 814. If there are nine leading zeros, the system proceeds to state 818. If there are less than six leading zeros, the system proceeds to state 822.

In state 806, the system shifts away the first six zeros, and gets two additional bits from the input stream. The system uses the resulting five bits to access a five-bit lookup table, such as lookup table 602 from FIG. 6. The system then proceeds to state 808. In state 808, the system decodes a symbol corresponding to the codeword using the five-bit lookup. The system then returns to state 802 to repeat the process on a new codeword.

In state 810, the system shifts away the first seven zeros, and gets an additional four bits from the input stream. The system uses the resulting six bits to access a six-bit lookup table, such as lookup table 604 from FIG. 6. The system then proceeds to state 812. In state 812, the system decodes a symbol corresponding to the codeword using the six-bit lookup. The system then returns to state 802 to repeat the process on a new codeword.

In state 810, the system shifts away the first eight zeros, and gets an additional five bits from the input stream. The system uses the resulting six bits to access a six-bit lookup table, such as lookup table 606 from FIG. 6. The system then proceeds to state 816. In state 816, the system decodes a symbol corresponding to the codeword using the six-bit lookup. The system then returns to state 802 to repeat the process on a new codeword.

In state 818, the system shifts away the first nine zeros, and gets an additional eight bits from the input stream. The system uses the resulting eight bits to access an eight-bit lookup table, such as lookup table 504 from FIG. 5. The system them proceeds to state 820. In state 820, the system decodes a symbol corresponding to the codeword using the eight-bit lookup. It also shifts the remaining bits to realign the bits that were not part of the codeword. The system then returns to state 802 to repeat the process on a new codeword.

In state 822, there are less than six leading zeros in the codeword. Hence, the codeword is nine bits or less in size, and no additional lookups are required. The system decodes one or more symbols from the nine bits, and shifts the remaining bits to realign the bits that were not part of the current codeword. The system then returns to state 802 to repeat the process on a new codeword.

The method outlined in FIG. 8 has certain performance advantages. When the system determines that exactly six, seven or eight leading zeros are present, the system knows that variable length codeword 300 is exactly 11, 13 or 14 bits in size, respectively. Hence, after the symbol is decoded in the secondary lookup table no additional shifting is required to realign codeword boundaries. This improves system performance by dispensing with a time-consuming realignment process.

Description of Parallel Hardware Implementation

The methods outlined in FIGS. 4, 7 and 8 perform lookups for a given codeword sequentially. This is appropriate for software implementations and simple hardware implementations. However, performance can be improved if the table lookups are performed in parallel in a hardware implementation. FIGS. 3, 5 and 6 illustrate how certain bits from VLC 300 are used to index the various lookup tables. However, the connections specified in FIGS. 3, 5 and 6 additionally indicate how bits from VLC 300 can be coupled to respective lookup tables in order to perform the table lookups in parallel.

For example, in FIG. 3, the first nine bits of VLC 300 are used to index nine-bit lookup table 302, while the last 11 bits of VLC 300 are used to index 11-bit lookup table 304. The access to 11-bit lookup table 304 can proceed in parallel with the access into nine-bit lookup table 302. The result of the access into 11-bit lookup table 304 is used if it is required. Otherwise, it is ignored.

Description of Table Entry Structure

Figure 9:
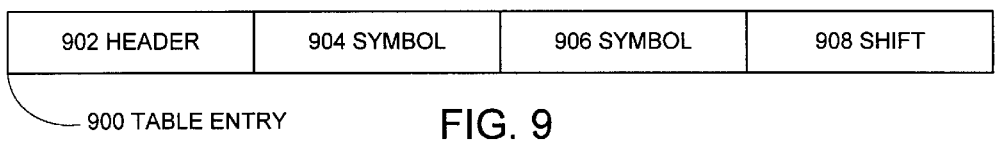
FIG. 9 is a diagram illustrating the structure of an entry 900 in a lookup table in accordance with an embodiment of the present invention.

FIG. 9 is a diagram illustrating the structure of an entry 900 in a lookup table in accordance with an embodiment of the present invention. Table entry 900 includes header 902, symbol 904, symbol 906 and shift 908. Header 902 contains an indication of how many symbols are contained in table entry 900. In the illustrated example, there are two entries. Header 902 can also include an end-of-block symbol or an escape symbol. Placing these symbols in the header can speed the processing of entries where the symbol is an end-of-block or an escape symbol. Symbols 904 and 906 include symbols corresponding to two codewords in the index to entry 900. Shift 908 indicates the number of bits to be shifted to realign the data from encoded bitstream 200 (see FIG. 2).

The foregoing descriptions of embodiments of the invention have been presented for purposes of illustration and description only. They are not intended to be exhaustive or to limit the invention to the forms disclosed. Obviously, many modifications and variations will be apparent to practitioners skilled in the art.

What is claimed is:

1. A method for decoding a variable length code, comprising:
   receiving a first set of bits from an encoded bitstream;
   using the first set of bits to index to an entry in a first table, the first table containing decoded symbols corresponding to variable length codewords in the first set of bits;
   returning multiple decoded symbols from the indexed entry if the first set of bits contains multiple codewords;
   returning a single decoded symbol from the indexed entry if the first set of bits contains only a single codeword; and
   returning at most a partial decoded symbol from the indexed entry if the first set of bits contains only a partial codeword.

2. The method of claim 1, including if the first set of bits contains only a partial codeword:
   retrieving a second set of bits from the encoded bit stream; and
   using the second set of bits to index an entry in a second table, the second table containing decoded symbols corresponding to variable length codewords spanning the first set of bits and the second set of bits.

3. The method of claim 2, wherein using the second set of bits to index an entry in the second table includes using bits from both the first set of bits and the second set of bits to index the entry.

4. The method of claim 2, wherein using the second set of bits to index an entry in the second table takes place in parallel with using the first set of bits to index an entry in the first table.

5. The method of claim 2, wherein using the second set of bits to index an entry in the second table takes place after using the first set of bits to index an entry in the first table.

6. The method of claim 1, including:
   examining the first set of bits for a prefix value from a set of prefix values; and
   if a prefix value from the set of prefix values is found, determining from the prefix value the length of the codeword containing the prefix value, wherein the length of the codeword is greater than the length of the prefix value.

7. The method of claim 1, including if the first set of bits contains only a partial codeword:
   retrieving a second set of bits from the encoded bit stream; and
   using the second set of bits to index an entry in a second table, the second table containing decoded symbols corresponding to variable length codewords spanning the first set of bits and the second set of bits.

8. The method of claim 1, including if the first set of bits contains only a partial codeword:
   receiving a second set of bits from the encoded bit stream;
   using the second set of bits to index an entry in a second table if the first set of bits contains a partial codeword indicating an entry from the second table is required; and
   using the second set of bits to index an entry in a third table if the first set of bits contains a partial codeword indicating an entry from the third table is required.

9. The method of claim 1, wherein using the first set of bits to index an entry in a first table includes indexing an entry containing a header.

10. The method of claim 9, wherein the header includes the number of codewords contained in the entry.

11. The method of claim 9, wherein the header includes an end-of-block symbol.

12. The method of claim 9, wherein the header includes an escape symbol.

13. The method of claim 1, wherein using the first set of bits to index an entry into a first table includes indexing an entry containing a shift value, the shift value indicating a number of bits to be shifted to realign data from the encoded bit stream.

14. The method of claim 1, wherein the encoded bitstream is encoded according to the Joint Photographer Experts Group (JPEG) standard.

15. The method of claim 1, wherein the encoded bitstream is encoded according to the Motion Picture Experts Group (MPEG) standard.

16. The method of claim 1, wherein the encoded bitstream is encoded according to the H.263 video conferencing standard.

17. A method for decoding a variable length code, comprising:
   receiving a first set of bits and a second set of bits from an encoded bitstream;
   using the first set of bits to index to an entry into a first table, the first table containing decoded symbols corresponding to variable length codewords in the first set of bits; and
   using the second set of bits to index an entry in a second table in parallel with using the first set of bits to index an entry in the first table, the second table containing decoded symbols corresponding to variable length codewords spanning the first set of bits and the second set of bits;
   wherein indexing an entry in the first table,
      returns multiple decoded symbols from the indexed entry if the first set of bits contains multiple codewords,
      returns only a single decoded symbol from the indexed entry if the first set of bits contains only a single codeword, and
      returns at most a partial decoded symbol from the indexed entry if the first set of bits contains only a partial codeword.

18. A method for decoding a variable length code, comprising:
   receiving a first set of bits and a second set of bits from an encoded bitstream;
   using the first set of bits to index to an entry into a first table, the first table containing decoded symbols corresponding to variable length codewords in the first set of bits; and
   using the second set of bits to index an entry in a second table in parallel with using the first set of bits to index an entry in the first table, the second table containing decoded symbols corresponding to variable length codewords spanning the first set of bits and the second set of bits;

wherein the first set of bits and the second set of bits have bits in common.

19. A method for decoding a variable length code, comprising:

receiving a first set of bits and a second set of bits from an encoded bitstream;

using the first set of bits to index to an entry into a first table, the first table containing decoded symbols corresponding to variable length codewords in the first set of bits; and using the second set of bits to index an entry in a second table in parallel with using the first set of bits to index an entry in the first table, the second table containing decoded symbols corresponding to variable length codewords spanning the first set of bits and the second set of bits;

wherein the first set of bits and the second set of bits are disjoint.

20. A method for decoding a variable length code, comprising:

receiving a first set of bits from an encoded bitstream;

using the first set of bits as an index to an entry in a first table, the first table containing decoded symbols corresponding to variable length codewords in the first set of bits; and if the first set of bits contains only a partial codeword:
receiving a second set of bits from the encoded bit stream,
using the second set of bits to index an entry in a second table if the first set of bits contains a partial codeword indicating an entry from the second table is required, and
using the second set of bits to index an entry in a third table if the first set of bits contains a partial codeword indicating an entry from the third table is required.

21. The method of claim 20, wherein indexing an entry in the first table:

returns multiple decoded symbols from the indexed entry if the first set of bits contains multiple codewords;

returns only a single decoded symbol from the indexed entry if the first set of bits contains only a single codeword; and returns at most a partial decoded symbol from the indexed entry if the first set of bits contains only a partial codeword.

22. The method of claim 20, wherein the first set of bits and the second set of bits have bits in common.

23. The method of claim 20, wherein the first set of bits and the second set of bits are disjoint.

24. An apparatus for decoding a variable length code, comprising:

an input from an encoded bitstream, the input including a first set of bits and a second set of bits;

a first table indexed by the first set of bits, the first table including entries containing decoded symbols corresponding to variable length codewords in the first set of bits; and a second table indexed by the second set of bits, the second table including entries containing decoded symbols corresponding to variable length codewords spanning the first set of bits and the second set of bits;

wherein the first table includes at least one entry containing multiple symbols for the case where the first set of bits contains multiple codewords.

25. The apparatus of claim 24, wherein the first set of bits and the second set of bits have bits in common.

26. The apparatus of claim 24, wherein the first set of bits and the second set of bits are disjoint.

27. The apparatus of claim 24, wherein the first table and the second table are configured to allow a lookup from the first table to proceed in parallel with a lookup from the second table.

28. The apparatus of claim 24, wherein the first table and the second table are configured so that a lookup in the first table precedes a lookup in the second table.

29. The apparatus of claim 24, including:

a third table indexed by the second set of bits, the third table including entries containing decoded symbols corresponding to variable length codewords spanning the first set of bits and the second set of bits;

wherein the second table and the third table are configured so that second table is indexed when the first set of bits contains a partial codeword indicating an entry from the second table is required, and the third table is indexed when the first set of bits contains a partial codeword indicating an entry from the third table is required.

30. The apparatus of claim 24, wherein entries in the first table include a header indicating the number of symbols contained in the entry.

31. The apparatus of claim 24, wherein entries in the first table include a header that can contain an end-of-block symbol.

32. The apparatus of claim 24, wherein entries in the first table include a header that can contain an escape symbol.

33. The apparatus of claim 24, wherein entries in the first table include a shift value indicating a number of bits to be shifted to realign the input from the encoded bit stream.

34. The apparatus of claim 24, wherein the encoded bitstream is encoded according to the Joint Photographer Experts Group (JPEG) standard.

35. The apparatus of claim 24, wherein the encoded bitstream is encoded according to the Motion Picture Experts Group (MPEG) standard.

36. The apparatus of claim 24, wherein the encoded bitstream is encoded according to the H.263 video conferencing standard.

37. An apparatus for decoding a variable length code, comprising:

an input from an encoded bitstream, the input including a first set of bits and a second set of bits;

a first table indexed by the first set of bits, the first table including entries containing decoded symbols corresponding to variable length codewords in the first set of bits; and a second table indexed by the second set of bits, the second table including entries containing decoded symbols corresponding to variable length codewords spanning the first set of bits and the second set of bits;

wherein the first table and the second table are configured to allow a lookup from the first table to proceed in parallel with a lookup from the second table.

38. The apparatus of claim 37, wherein the first table includes at least one entry containing multiple symbols for the case where the first set of bits contains multiple codewords.

39. The apparatus of claim 37, wherein the first set of bits and the second set of bits have bits in common.

40. The apparatus of claim 37, wherein the first set of bits and the second set of bits are disjoint.

41. An apparatus for decoding a variable length code, comprising:

an input from an encoded bitstream, the input including a first set of bits and a second set of bits;

a first table indexed by the first set of bits, the first table including entries containing decoded symbols corresponding to variable length codewords in the first set of bits;

a second table indexed by the second set of bits, the second table including entries containing decoded symbols corresponding to variable length codewords spanning the first set of bits and the second set of bits; and a third table indexed by the second set of bits, the third table including entries containing decoded symbols corresponding to variable length codewords spanning the first set of bits and the second set of bits;

wherein the second table and the third table are configured so that second table is indexed when the first set of bits contains a partial codeword indicating an entry from the second table is required, and the third table is indexed when the first set of bits contains a partial codeword indicating an entry from the third table is required.

42. The apparatus of claim 41, wherein the first table includes at least one entry containing multiple symbols for the case where the first set of bits contains multiple codewords.

43. The apparatus of claim 41, wherein the first set of bits and the second set of bits have bits in common.

44. The apparatus of claim 41, wherein the first set of bits and the second set of bits are disjoint.

45. A computer readable storage medium storing instructions that when executed by a computer perform a method for decoding a variable length code, comprising:

receiving a first set of bits from an encoded bitstream;

using the first set of bits as an index to an entry in a first table, the first table containing decoded symbols corresponding to variable length codewords in the first set of bits;

returning multiple decoded symbols from the indexed entry if the first set of bits contains multiple codewords;

returning only a single decoded symbol from the indexed entry if the first set of bits contains only a single codeword;

returning at most a partial decoded symbol from the indexed entry if the first set of bits contains only a partial codeword;

retrieving a second set of bits from the encoded bit stream; and using the second set of bits to index an entry in a second table, the second table containing decoded symbols corresponding to variable length codewords spanning the first set of bits and the second set of bits.

46. An computer system including apparatus for decoding a variable length code, comprising:

a processor;

a data channel coupled to the processor;

an input from an encoded bitstream, the input including a first set of bits and a second set of bits;

a first table indexed by the first set of bits and coupled to the processor, the first table including entries containing decoded symbols corresponding to variable length codewords in the first set of bits; and a second table indexed by the second set of bits and coupled to the processor, the second table including entries containing decoded symbols corresponding to variable length codewords spanning the first set of bits and the second set of bits;

wherein the first table includes at least one entry containing multiple symbols for the case where the first set of bits contains multiple codewords.

* * * * *